US012604783B2

(12) United States Patent
Chang et al.

(10) Patent No.: US 12,604,783 B2
(45) Date of Patent: Apr. 14, 2026

(54) SEMICONDUCTOR DEVICE INCLUDING A HYBRID BONDING STRUCTURE

(71) Applicant: MACRONIX International Co., Ltd., Hsinchu (TW)

(72) Inventors: Shao-En Chang, Nantou County (TW); Tzung-Ting Han, Hsinchu City (TW); Meng-Hsuan Weng, Taichung City (TW); Chen-Yu Cheng, Hsinchu City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 364 days.

(21) Appl. No.: 18/474,231

(22) Filed: Sep. 26, 2023

(65) Prior Publication Data

US 2025/0105213 A1     Mar. 27, 2025

(51) Int. Cl.
H10W 90/00 (2026.01)
H10B 43/40 (2023.01)
(Continued)

(52) U.S. Cl.
CPC ............ *H10W 90/00* (2026.01); *H10B 80/00* (2023.02); *H10W 46/00* (2026.01);
(Continued)

(58) Field of Classification Search
CPC ....... H01L 25/0657; H01L 2224/08145; H01L 23/544; H01L 2223/54426;
(Continued)

(56) References Cited

U.S. PATENT DOCUMENTS

| | | | |
|---|---|---|---|
| 2016/0172405 A1 | 6/2016 | Hori | |
| 2019/0164914 A1* | 5/2019 | Hu | ........................ H01L 24/06 |

(Continued)

FOREIGN PATENT DOCUMENTS

| | | |
|---|---|---|
| TW | 202020998 | 6/2020 |
| TW | 202111895 | 3/2021 |
| TW | 202238755 | 10/2022 |

OTHER PUBLICATIONS

"Office Action of Taiwan Counterpart Application", issued on Jul. 2, 2024, pp. 1-8.

*Primary Examiner* — Sonya McCall-Shepard
(74) *Attorney, Agent, or Firm* — J.C. PATENTS

(57) ABSTRACT

Provided is a semiconductor device for manufacturing a 3D NAND flash memory with high capacity and high performance. The semiconductor device includes: a first device structure layer on a substrate; an interconnect structure layer on the first device structure layer, which includes first pads at a surface thereof; a second device structure layer on the interconnect structure layer, which includes second pads at a surface thereof; a pattern structure at an interface between the interconnect structure layer and the second device structure layer; a first seal ring at the surface of the interconnect structure layer, which surrounds the pattern structure; a second seal ring at the surface of the second device structure layer, which surrounds the pattern structure. The first pad is connected to the second pad, and the first seal ring is connected to the second seal ring.

20 Claims, 6 Drawing Sheets

(51) Int. Cl.
   *H10B 80/00*        (2026.01)
   *H10W 46/00*        (2026.01)
   *H10W 90/20*        (2026.01)

(52) U.S. Cl.
   CPC ........ *H10W 46/301* (2026.01); *H10W 90/297*
   (2026.01); *H10W 90/792* (2026.01)

(58) Field of Classification Search
   CPC .......... H01L 2225/06541; H01L 24/08; H01L
   2924/1438; H01L 2924/35121; H01L
   23/585; H10B 80/00; H10B 43/40
   See application file for complete search history.

(56)                    References Cited

U.S. PATENT DOCUMENTS

| | | | |
|---|---|---|---|
| 2022/0285234 A1 | 9/2022 | Yokomizo et al. | |
| 2023/0215818 A1 | 7/2023 | Chang et al. | |

* cited by examiner

SEMICONDUCTOR DEVICE INCLUDING A HYBRID BONDING STRUCTURE

BACKGROUND

Technical Field

The present invention relates to a semiconductor device, and in particular to a semiconductor device which includes a hybrid bonding structure.

Description of Related Art

In a hybrid bonding process, two chips are bonded together to form a bonding structure with the active surfaces of the two chips facing each other, wherein the dielectric layer of one chip is bonded with the dielectric layer of another chip, and the pads of one chip are bonded with the pads of another chip.

However, at the surface of the chip, in addition to the pads, there are devices with a larger size, such as various mark structures. After bonding the two chips, when the bonding structure is subjected to high temperature or an external force, film peeling is likely to be occurred around the devices with a larger size located at the bonding interface, and the film peeling may even be extended to the entire chip, causing the chip damage.

SUMMARY

The present invention provides a semiconductor device including a hybrid bonding structure, wherein a pattern structure with a larger width at the bonding interface is surrounded by a seal ring.

The semiconductor device of present invention includes a substrate, a first device structure layer, an interconnect structure layer, a second device structure layer, a pattern structure, a first seal ring and a second seal ring. The first device structure layer is disposed on the substrate. The interconnect structure layer is disposed on the first device structure layer, and is electrically connected to the first device structure layer. The interconnect structure layer includes a plurality of first pads located at a surface of the interconnect structure layer. The second device structure layer is disposed on the interconnect structure layer. The second device structure layer includes a plurality of second pads located at a surface of the second device structure layer. The pattern structure is disposed at a first interface between the interconnect structure layer and the second device structure layer. The first seal ring is disposed at the surface of the interconnect structure layer and surrounds the pattern structure. The second seal ring is disposed at the surface of the second device structure layer and surrounds the pattern structure. Each of the first pads is connected to a corresponding second pad, and the first seal ring is connected to the second seal ring.

In an embodiment of the semiconductor device of the present invention, a width of the pattern structure is larger than a width of the first pad, and larger than a width of the second pad.

In an embodiment of the semiconductor device of the present invention, a width of the first seal ring is greater than or equal to half of a width of the first pad and less than or equal to 3 times of the width of the first pad.

In an embodiment of the semiconductor device of the present invention, a width of the second seal ring is greater than or equal to half of a width of the second pad and less than or equal to 3 times the width of the second pad.

In an embodiment of the semiconductor device of the present invention, a width of the pattern structure is greater than or equal to 4 times a width of the first pad, and greater than or equal to 4 times a width of the second pad.

In an embodiment of the semiconductor device of the present invention, the pattern structure is not electrically connected to the interconnect structure layer and not electrically connected to the second device structure layer.

In an embodiment of the semiconductor device of the present invention, the pattern structure includes a sign mark or an alignment mark.

In an embodiment of the semiconductor device of the present invention, the pattern structure is located in the interconnect structure layer.

In an embodiment of the semiconductor device of the present invention, a distance between the first seal ring and the pattern structure is greater than or equal to 2 times a width of first pad.

In an embodiment of the semiconductor device of the present invention, the pattern structure is located in the second device structure layer.

In an embodiment of the semiconductor device of the present invention, a distance between the second seal ring and the pattern structure is greater than or equal to 2 times a width of second pad.

In an embodiment of the semiconductor device of the present invention, the plurality of the first pads includes at least one first electrically-connected pad and at least one first dummy pad, the plurality of the second pads includes at least one second electrically-connected pad and at least one second dummy pad, each first electrically-connected pad is connected to a corresponding second electrically-connected pad of the at least one second electrically-connected pad, and each first dummy pad is connected to a corresponding second dummy pad of the at least one second dummy pad.

In an embodiment of the semiconductor device of the present invention, the first electrically-connected pad is electrically connected to the first device structure layer.

In an embodiment of the semiconductor device of the present invention, the second electrically-connected pad is electrically connected to the second device structure layer.

In an embodiment of the semiconductor device of the present invention, there is no first pad between the first seal ring and the pattern structure, and there is no second pad between the second seal ring and the pattern structure.

In an embodiment of the semiconductor device of the present invention, a width of the first seal ring is the same as a width of the second seal ring.

In an embodiment of the semiconductor device of the present invention, a width of the first seal ring is different from a width of the second seal ring.

In an embodiment of the semiconductor device of the present invention, there is a second interface between the first pad and the second pad.

In an embodiment of the semiconductor device of the present invention, the second device structure layer includes a memory structure layer.

In an embodiment of the semiconductor device of the present invention, the memory structure layer includes a three-dimensional (3D) flash memory structure.

Based on the above, in the semiconductor device of the present invention, the first seal ring and the second seal ring surround the pattern structure. Therefore, when the semiconductor device is subjected to high temperature or an external force in subsequent processes, the first seal ring and the second seal ring may effectively limit the region where the film peeling is occurred.

DESCRIPTION OF THE EMBODIMENTS

The embodiments are listed below and described in detail with the accompanying drawings, but the provided embodiments are not intended to limit the scope of the present invention. In addition, the drawings are for illustration purposes only and are not drawn to original scale. In order to facilitate understanding, the same devices will be described with the same symbols in the following descriptions.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Also, herein, a range expressed by "one value to another value" is a general representation to avoid enumerating all values in the range in the specification. Thus, the recitation of a particular numerical range encompasses any numerical value within that numerical range, as well as smaller numerical ranges bounded by any numerical value within that numerical range.

Figure 1:
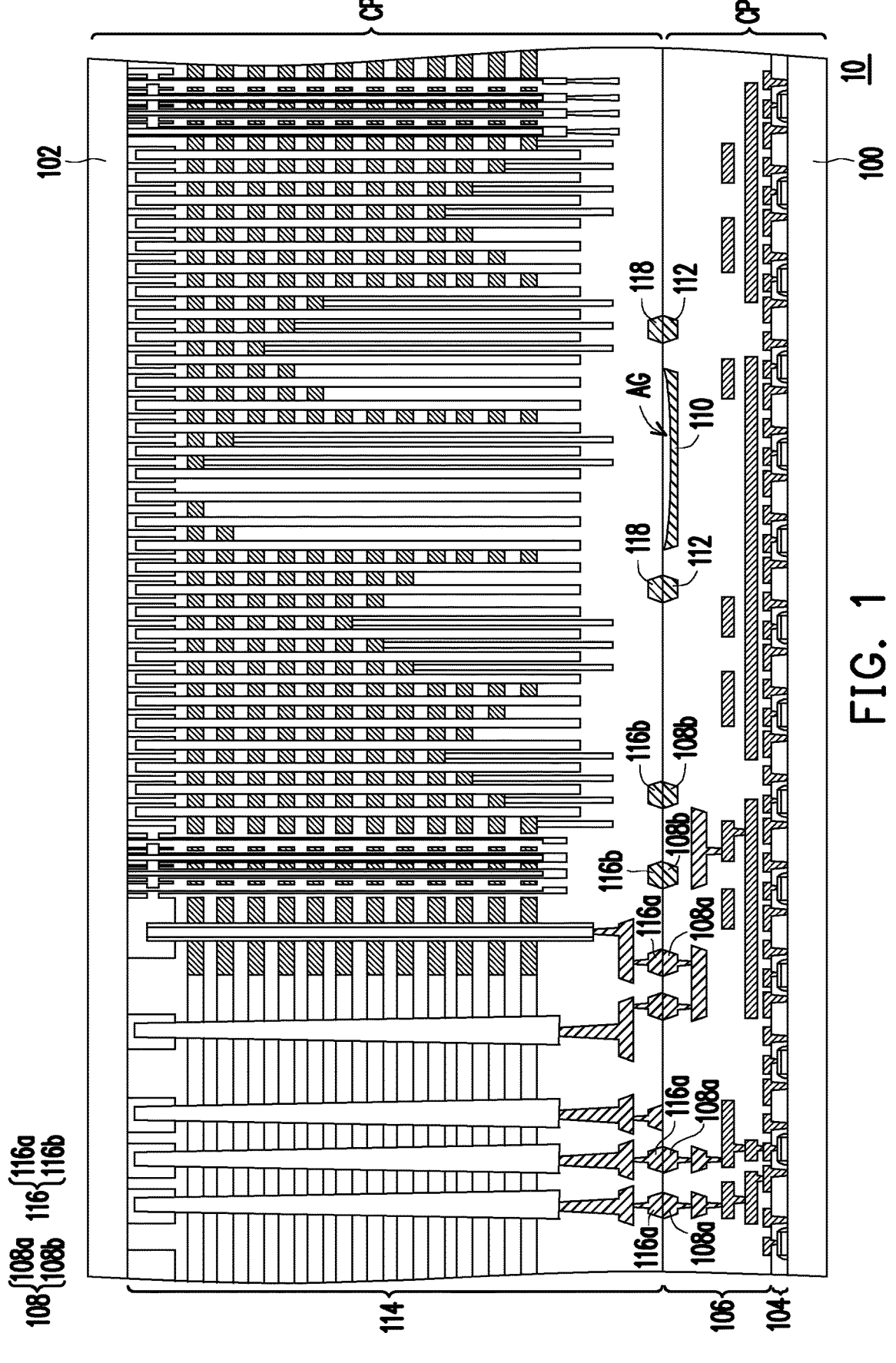
FIG. 1 is a schematic cross-sectional view of the semiconductor device according to the first embodiment of the present invention.

FIG. 1 is a schematic cross-sectional view of the semiconductor device according to the first embodiment of the present invention.

Referring to FIG. 1, the semiconductor device 10 of the present embodiment includes a first substrate 100, a second substrate 102, a first device structure layer 104, an interconnect structure layer 106, a pattern structure 110, a first seal ring 112, a second device structure layer 114 and a second seal ring 118. Depending on the types of the first device structure layer 104 and the second device structure layer 114, the semiconductor device 10 may be applicable to various semiconductor apparatus, which is not limited by the present invention. For example, the semiconductor device 10 may be applicable to a 3D NAND flash memory with high capacity and high performance. The following will take the semiconductor device 10 suitable for a 3D flash memory as an example to illustrate.

In the present embodiment, the second substrate 102 is disposed on the first substrate 100. In the present embodiment, an active surface of the first substrate 100 and an active surface of the second substrate 102 are opposite to each other. Each of the first substrate 100 and the second substrate 102 may be a silicon substrate or a silicon-on-insulator (SOI) substrate.

The first device structure layer 104 is disposed on the active surface of the first substrate 100 and located between the first substrate 100 and the second substrate 102. In the present embodiment, the first device structure layer 104 may include transistors, device isolation structures, contacts, a dielectric layer covering the above devices, etc., but the present invention is not limited thereto. In FIG. 1, the first device structure layer 104 is simply illustrated as an example. The detailed structure of the first device structure layer 104 is well known to those skilled in the art, and will not be described further here.

The interconnect structure layer 106 is disposed on the first device structure layer 104 and located between the first device structure layer 104 and the second substrate 102. The interconnect structure layer 106 is electrically connected to the first device structure layer 104. In the present embodiment, the interconnect structure layer 106 may include a plurality of circuit layers, a plurality of conductive vias, a dielectric layer covering the above devices, etc. In the interconnect structure layer 106, the lowest circuit layer may be connected to the contacts in the first device structure layer 104, and the conductive vias may connect two adjacent circuit layers. In FIG. 1, the interconnect structure layer 106 is simply illustrated as an example. The detailed structure of the interconnect structure layer 106 is well known to those skilled in the art, and will not be described further here.

In addition, the interconnect structure layer 106 includes a plurality of first pads 108. The first pads 108 are disposed at the surface of the interconnect structure layer 106. In detail, in the present embodiment, the first pads 108 are embedded in the interconnect structure layer 106, and include first electrically-connected pads 108a and first dummy pads 108b. In FIG. 1, the number of first electrically-connected pads 108a and first dummy pads 108b is only exemplary, and the invention is not limited thereto. The first electrically-connected pads 108a may be electrically connected to the uppermost circuit layer in the interconnect structure layer 106 to provide the electrical signal transmission function and the bonding function. The first dummy pads 108b are not electrically connected to the devices in the interconnect structure layer 106 and only provide the bonding function.

The pattern structure 110 and the first seal ring 112 are disposed at the surface of the interconnect structure layer 106. In detail, in the present embodiment, the pattern structure 110 and the first seal ring 112 are embedded in the interconnect structure layer 106, and the first seal ring 112 surrounds the pattern structure 110. The pattern structure 110 and the first seal ring 112 are not electrically connected to the interconnect structure layer 106. The pattern structure 110 may be a sign mark, an alignment mark or any other mark, and the present invention is not limited thereto.

Figure 2A:
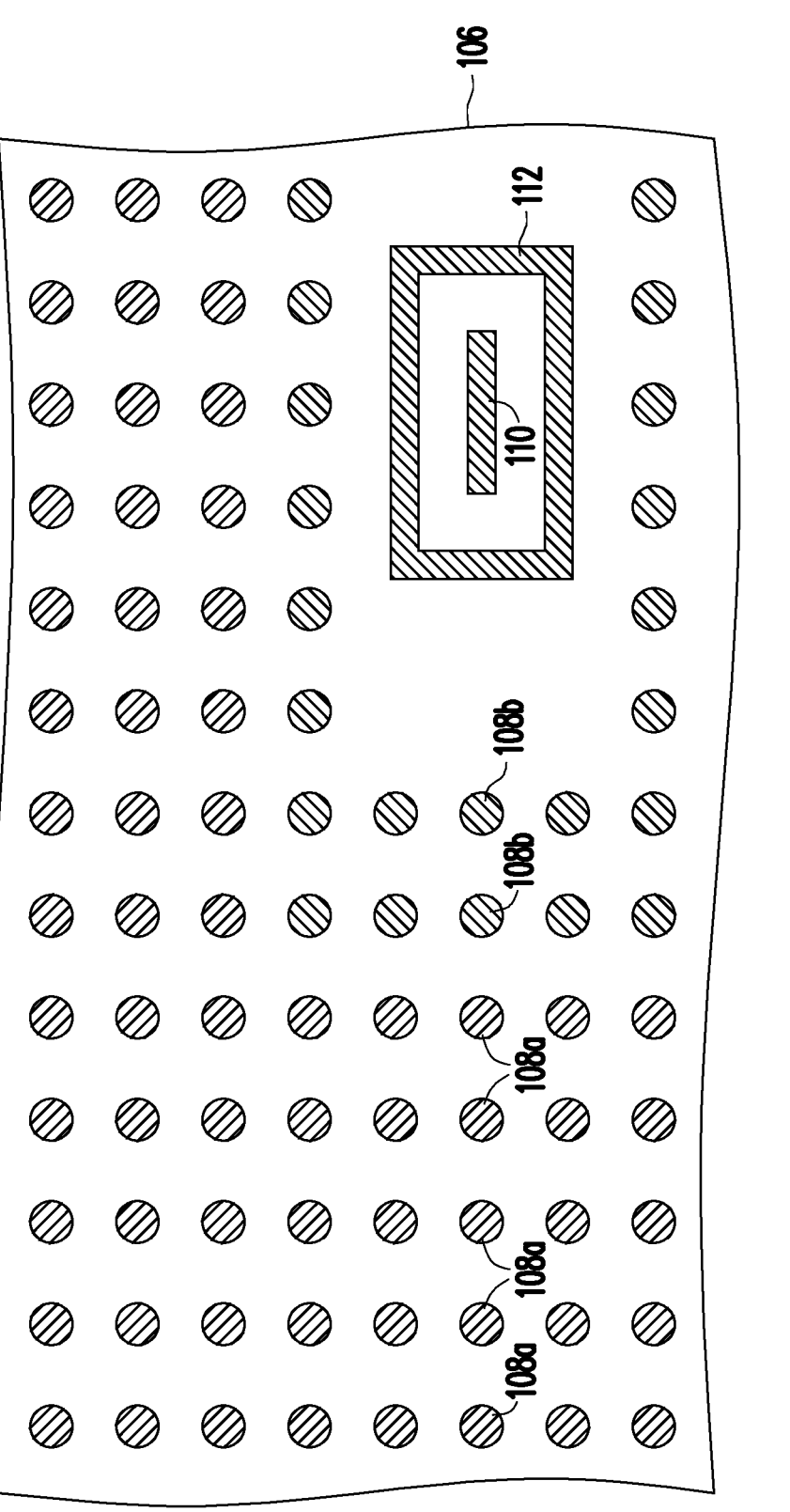
FIG. 2A is a schematic top view of the interconnect structure layer in FIG. 1.

FIG. 2A is a schematic top view of the interconnect structure layer in FIG. 1. As shown in FIG. 2A, in the present embodiment, the first pads 108 are disposed at the surface of the interconnect structure layer 106 and arranged in an array, but the present invention is not limited thereto. In addition, the pattern structure 110 and the first seal ring 112 are located outside the array region. The first seal ring 112 surrounds the pattern structure 110 and is not connected to the pattern structure 110. In the present embodiment, a distance between the first seal ring 112 and the pattern structure 110 is, for example, greater than or equal to 2 times a width of first pad 108. There is no first pad 108 between the first seal ring 112 and the pattern structure 110.

Compared to the first pads 108, the pattern structure 110 has a larger size. Since the pattern structure 110 has a large size, dishing may be occurred at the surface of the pattern structure 110 during forming the pattern structure 110. In the present embodiment, a width of the pattern structure 110 is greater than a width of the first pad 108. For example, the width of the pattern structure 110 may be greater than or equal to 4 times the width of the first pad 108. In addition, a width of the first seal ring 112 is greater than or equal to half of the width of the first pad 108 and less than or equal to 3 times the width of the first pad 108. In FIG. 2A, the shapes of the first pad 108, the pattern structure 110 and the first seal ring 112 are only exemplary, and the present invention is not limited thereto.

The first substrate 100, the first device structure layer 104, the interconnect structure layer 106, the first pads 108, the pattern structure 110 and the first seal ring 112 may consti- tute a first chip CP1 in the present embodiment. In other words, FIG. 2A may be regarded as a schematic top view of the first chip CP1.

Referring to FIG. 1, the second device structure layer 114 is disposed on the active surface of the second substrate 102 and located between thein a case where the semiconductor device 10 is applied to a 3D NAND flash memory, the second device structure layer 114 is a memory structure layer, which may at least include a stacked structure com- posed of a plurality of insulating layers and a plurality of conductive layers, a vertical channel (VC) structure pen- etrating through the stacked structure, contacts, a dielectric layer covering the above devices, etc., but the present invention is not limited thereto. In FIG. 1, the second device structure layer 114 is simply illustrated as an example. The detailed structure of the second device structure layer 114 is well known to those skilled in the art, and will not be described further here.

In other embodiments, in a case where the semiconductor device 10 is applied to other semiconductor apparatus, the second device structure layer 114 may have the required configuration. For example, the second device structure layer may include a configuration similar to the first device structure layer 104 and the interconnect structure layer 106, but the present invention is not limited thereto.

In addition, the second device structure layer 114 includes a plurality of second pads 116. The second pads 116 are disposed at the surface of the second device structure layer 114. In detail, in the present embodiment, the second pads 116 are embedded in the second device structure layer 114 and include second electrically-connected pads 116a and second dummy pads 116b. The second electrically-con- nected pads 116a may be electrically connected to the contacts or the conductive layers in the second device structure layer 114 to provide the electrical signal transmis- sion function and the bonding function. The second dummy pads 116b are not electrically connected to the devices in the second device structure layer 114 and only provide the bonding function.

The positions and number of the second electrically- connected pads 116a correspond to the positions and number of the first electrically-connected pads 108a, and the positions and number of the second dummy pads 116b corre- spond to the positions and number of the first dummy pads 108b. The second electrically-connected pad 116a is con- nected to the corresponding first electrically-connected pad 108a and there is an interface between the second electri- cally-connected pad 116a and the corresponding first elec- trically-connected pad 108a, and the second dummy pad 116b is connected to the corresponding second dummy pad 108b and there is an interface between the second dummy pad 116b and the corresponding second dummy pad 108b. In the present embodiment, the second electrically-connected pad 116a is aligned with the corresponding first electrically- connected pad 108a, and the second dummy pad 116b is aligned with the corresponding second dummy pad 108b, but the present invention is not limited thereto. In other embodiments, there may be an alignment shift between the second electrically-connected pad 116a and the correspond- ing first electrically-connected pad 108a, and there may be an alignment shift between the second dummy pad 116b and the corresponding second dummy pad 108b.

The second seal ring 118 is disposed at the surface of the second device structure layer 114. In detail, in the present embodiment, the second seal ring 118 is embedded in the second device structure layer 114. The second seal ring 118 is connected to the first seal ring 112, and there is an interface between the second seal ring 118 and the first seal ring 112. Furthermore, the position of the second seal ring 118 corresponds to the position of the first seal ring 112 to surround the pattern structure 110. The second seal ring 118 is not electrically connected to the second device structure layer 114. In the present embodiment, the second seal ring 118 is aligned with the first seal ring 112, but the present invention is not limited thereto. In other embodiments, there may be an alignment shift between the second seal ring 118 and the first seal ring 112.

Figure 2B:
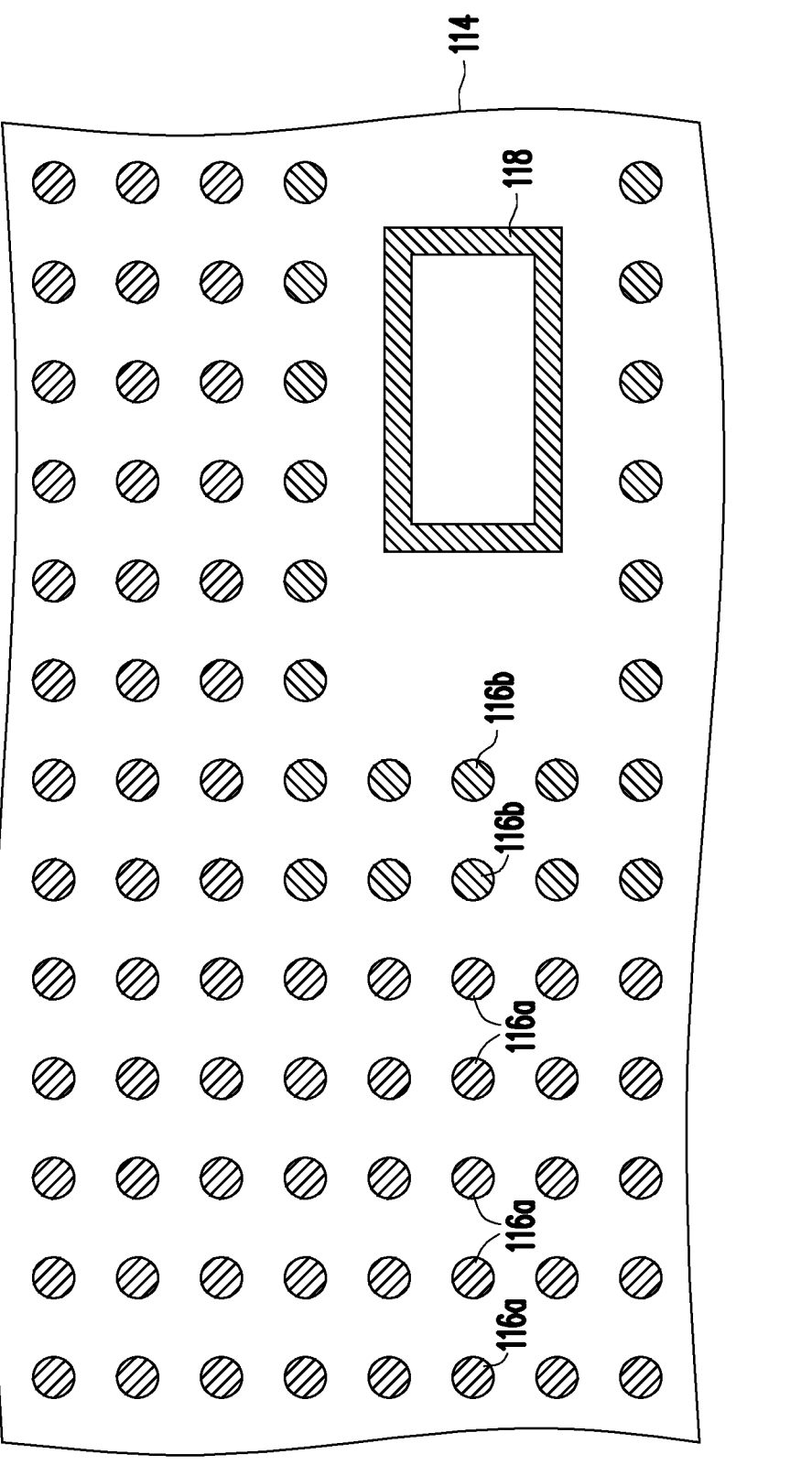
FIG. 2B is a schematic top view of the second device structure layer in FIG. 1.

FIG. 2B is a schematic top view of the second device structure layer in FIG. 1. As shown in FIG. 2B, in the present embodiment, the second pads 116 are disposed at the surface of the second device structure layer 114 and arranged in an array corresponding to the first pads 116. In addition, the second seal ring 118 corresponds to the first seal ring 112 and located outside the array region. There is no second pad 116 in the region surrounded by the second seal ring 118.

In the present embodiment, a width of the second seal ring 118 is the same as the width of the first seal ring 112, but the present invention is not limited thereto. In other embodi- ments, the width of the second seal ring 118 may be different from the width of the first seal ring 112. In addition, the width of the second seal ring 118 is greater than or equal to half of the width of the second pad 116 and less than or equal to 3 times the width of the second pad 116. In FIG. 2B, the shapes of the second pad 116 and the second seal ring 118 are only exemplary, and the present invention is not limited thereto. The shapes of the second pad 116 and the second seal ring 118 may be the same as or different from the shapes of the first pad 108 and the first seal ring 112, which is not limited by the present invention.

The second substrate 102, the second device structure layer 114, the second pads 116 and the second seal ring 118 may constitute a second chip CP2 in the present embodi- ment. In other words, FIG. 2B may be regarded as a schematic top view of the second chip CP2.

Based on the above, the semiconductor device 10 of the present includes a hybrid bonding structure formed by bonding the first chip CP1 and the second chip CP2 through hybrid bonding, and therefore there is an interface between the interconnect structure layer 106 of the first chip CP1 and the second device structure layer 114 of the second chip CP2 and the pattern structure 110 is located at the interface. In the embodiments of the disclosure, the active surface of the first substrate 100 of the first chip CP1 and the active surface of the second substrate 102 of the second chip CP2 are in a face-to-face configuration, and thus a bonding process is a face-to-face bonding process.

After the bonding process, a process may perform on the second substrate 102 of the second chip CP2. In at least one embodiment of the disclosure, the second substrate 102 of the second chip CP2 may be thinned down from a backside of the second substrate 102 by grinding, polishing or etching. The semiconductor device 10 is formed as shown in FIG. 1. In another embodiment of the disclosure, the second substrate 102 of the second chip CP2 may be completely removed. The semiconductor device 10 only includes the second device structure layer 114 of the second chip CP2 bonded to the interconnect structure layer 106 of the first chip CP1 (not shown).

In semiconductor device 10, the first seal ring 112 surrounds the pattern structure 110, and the second seal ring 118 also surrounds pattern structure 110. Therefore, when the semiconductor device 10 is subjected to high temperature or an external force in the subsequent process, since the pattern structure 110 is surrounded by the first seal ring 112 and the second seal ring 118, even if the film peeling is occurred around the air gap AG, the film peeling may only be limited within the region surrounded by the first seal ring 112 and the region surrounded by the second seal ring 118, and may not affect the region outside the first seal ring 112 and the region outside the second seal ring 118. That is, in the present embodiment, by disposing the first seal ring 112 and the second seal ring 118, the impact of the air gap AG on the device may be greatly reduced or even avoided.

In particular, in the present embodiment, the width of the first seal ring 112 is greater than or equal to half of the width of the first pad 108 and less than or equal to 3 times the width of the first pad 108, and the width of the second seal ring 118 is greater than or equal to half of the width of the second pad 116 and less than or equal to 3 times the width of the second pad 116, so the first seal ring 112 and the second seal ring 118 may effectively reduce or even avoid the impact of the air gap AG on the device.

When the width of the first seal ring 112 is less than half of the width of the first pad 108, the first seal ring 112 may not be effectively connected to the second seal ring 118, and the film peeling may not be effectively limited within the region surrounded by the first seal ring 112. When the width of the second seal ring 118 is less than half of the width of the second pad 116, the second seal ring 118 may not be effectively connected to the first seal ring 112, and the film peeling may not be effectively limited within the region surrounded by the second seal ring 118.

In addition, when the width of the first seal ring 112 is greater than 3 times the width of the first pad 108, the first seal ring 112 may have dishing at the surface like the pattern structure 110, resulting in an air gap in the semiconductor device 10. When the width of the second seal ring 118 is greater than 3 times the width of the second pad 116, the second seal ring 118 may have dishing at the surface like the pattern structure 110, resulting in an air gap in the semiconductor device 10.

Figure 3:
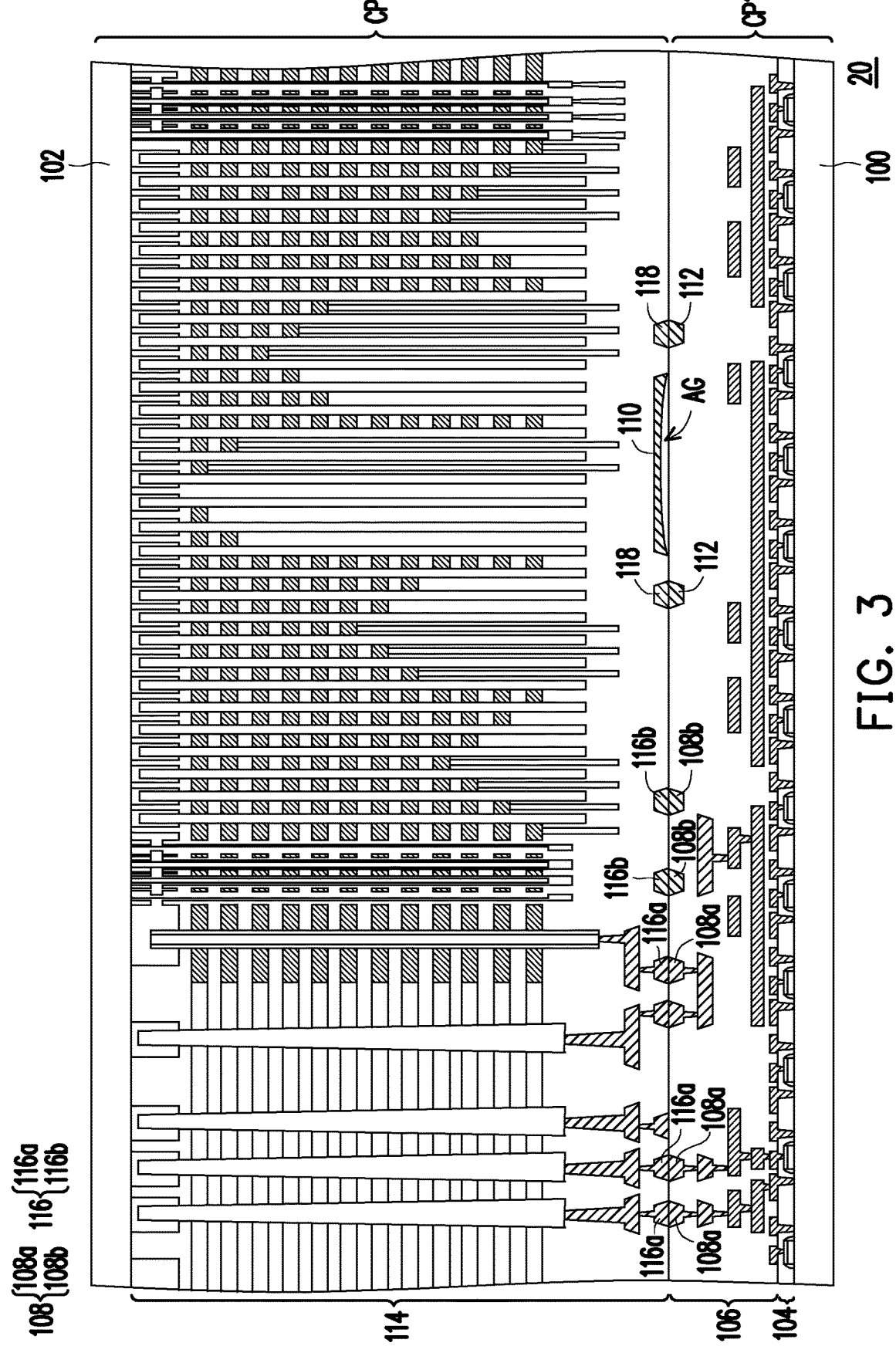
FIG. 3 is a schematic cross-sectional view of the semiconductor device according to the second embodiment of the present invention.
Figure 4A:
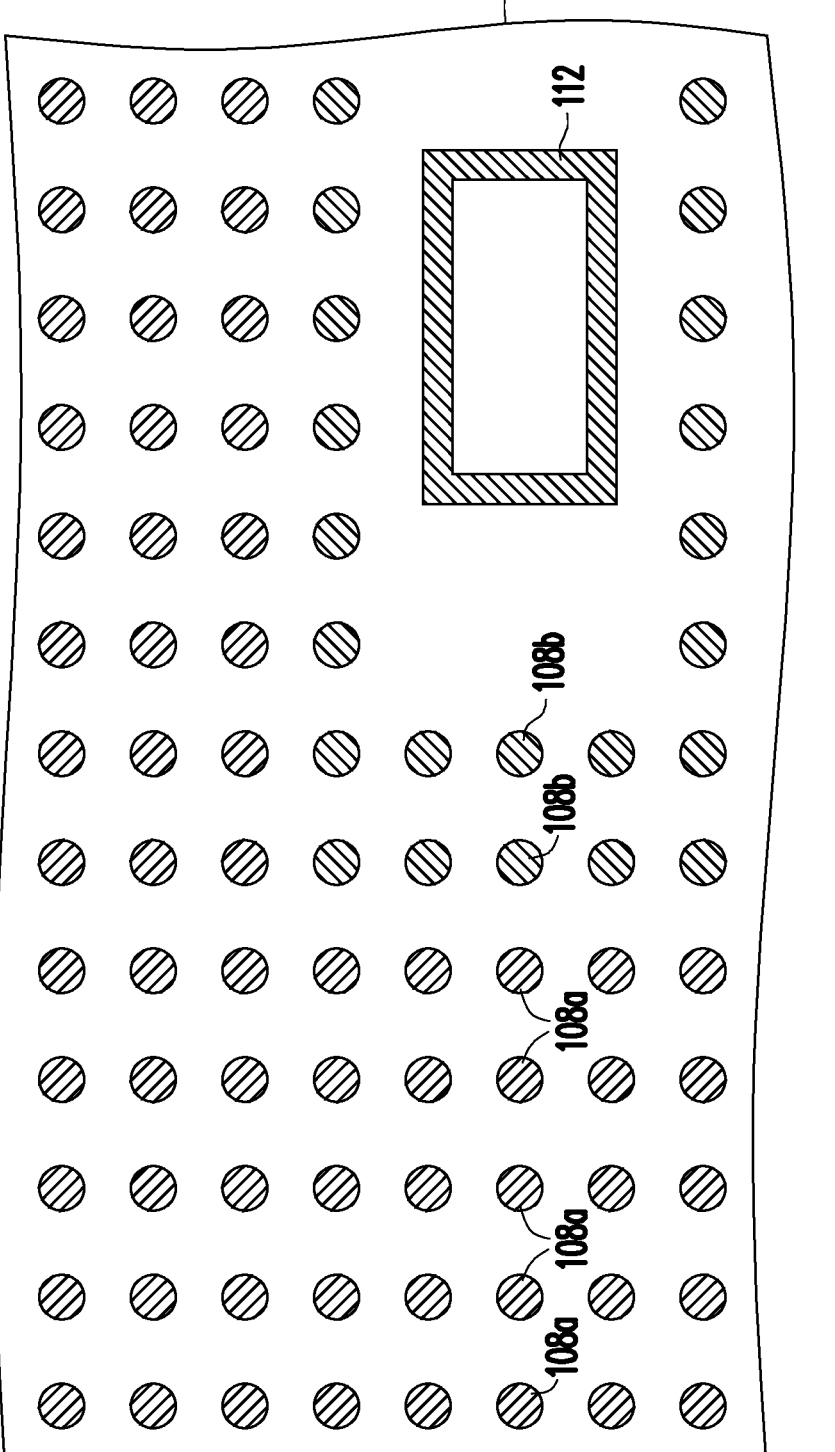
FIG. 4A is a schematic top view of the interconnect structure layer in FIG. 3.
Figure 4B:
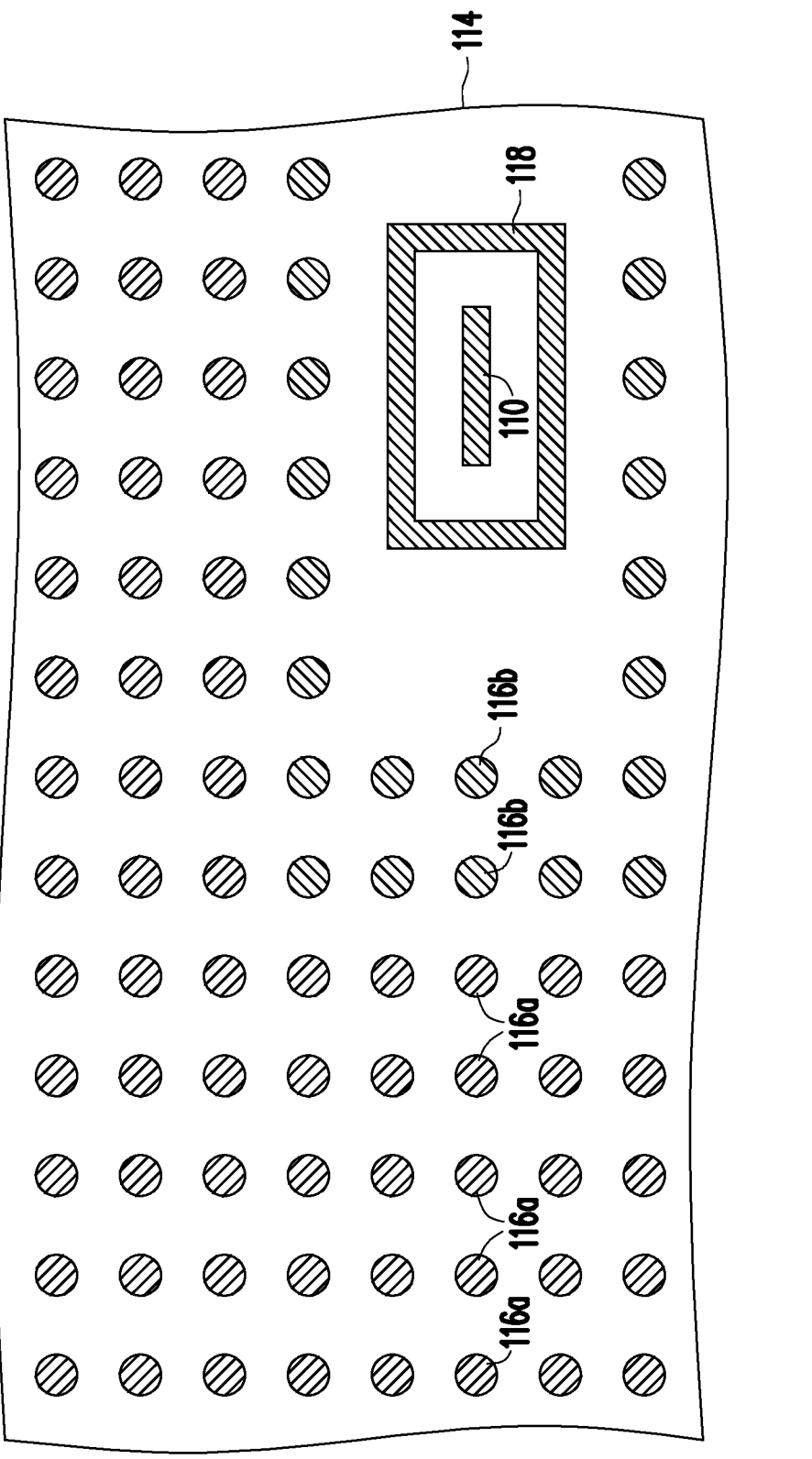
FIG. 4B is a schematic top view of the second device structure layer in FIG. 3.

FIG. 3 is a schematic cross-sectional view of the semiconductor device according to the second embodiment of the present invention. FIG. 4A is a schematic top view of the interconnect structure layer in FIG. 3. FIG. 4B is a schematic top view of the second device structure layer in FIG. 3. In the present embodiment, the same components as those in the first embodiment will be denoted by the same reference symbols and will not be described again.

Referring to FIGS. 3, 4A and 4B, the difference between the semiconductor device 20 of the present embodiment and the semiconductor device 10 of the first embodiment is that: in the semiconductor device 20, the pattern structure 110 is disposed at the interface between the interconnect structure layer 106 of the first chip CP1 and the second device structure layer 114 of the second chip CP2, and located at the surface of the second device structure layer 114.

In detail, in the present embodiment, the pattern structure 110 is embedded in the second device structure layer 114, and the second seal ring 118 surrounds the pattern structure 110. The pattern structure 110 is not electrically connected to the second device structure layer 114. A distance between the second seal ring 118 and the pattern structure 110 is, for example, greater than or equal to 2 times a width of second pad 116. There is no second pad 116 between the second seal ring 118 and the pattern structure 110.

Compared to the second pad 116, the pattern structure 110 has a larger size. In the present embodiment, the width of pattern structure 110 is greater than the width of second pad 116. For example, the width of the pattern structure 110 may be greater than or equal to 4 times the width of the second pad 116. In addition, the width of the first seal ring 112 is greater than or equal to half of the width of the first pad 108 and less than or equal to 3 times the width of the first pad 108, and the width of the second seal ring 118 is greater than or equal to half of the width of the second pad 116 and less than or equal to 3 times the width of the second pad 116.

In this way, when the semiconductor device 20 is subjected to high temperature or an external force in the subsequent process, since the pattern structure 110 is surrounded by the first seal ring 112 and the second seal ring 118, even if the film peeling is occurred around the air gap AG, the film peeling may only be limited within the region surrounded by the first seal ring 112 and the region surrounded by the second seal ring 118, and may not affect the region outside the first seal ring 112 and the region outside the second seal ring 118.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:

a substrate;

a first device structure layer disposed on the substrate;

an interconnect structure layer disposed on the first device structure layer, and electrically connected to the first device structure layer, wherein the interconnect structure layer comprises a plurality of first pads located at a surface of the interconnect structure layer;

a second device structure layer disposed on the interconnect structure layer, wherein the second device structure layer comprises a plurality of second pads located at a surface of the second device structure layer;

a pattern structure, disposed at a first interface between the interconnect structure layer and the second device structure layer;

a first seal ring, disposed at the surface of the interconnect structure layer and surrounding the pattern structure; and a second seal ring, disposed at the surface of the second device structure layer and surrounding the pattern structure, wherein each of the first pads is connected to a corresponding second pad of the plurality of second pads, and the first seal ring is connected to the second seal ring.

2. The semiconductor device of claim 1, wherein a width of the pattern structure is larger than a width of the first pad, and larger than a width of the second pad.

3. The semiconductor device of claim 1, wherein a width of the first seal ring is greater than or equal to half of a width of the first pad and less than or equal to 3 times of the width of the first pad.

4. The semiconductor device of claim 1, wherein a width of the second seal ring is greater than or equal to half of a width of the second pad and less than or equal to 3 times the width of the second pad.

5. The semiconductor device of claim 1, wherein a width of the pattern structure is greater than or equal to 4 times a width of the first pad, and greater than or equal to 4 times a width of the second pad.

6. The semiconductor device of claim 1, wherein the pattern structure is not electrically connected to the interconnect structure layer and not electrically connected to the second device structure layer.

7. The semiconductor device of claim 6, wherein the pattern structure comprises a sign mark or an alignment mark.

8. The semiconductor device of claim 1, wherein the pattern structure is located in the interconnect structure layer.

9. The semiconductor device of claim 8, wherein a distance between the first seal ring and the pattern structure is greater than or equal to 2 times a width of first pad.

10. The semiconductor device of claim 1, wherein the pattern structure is located in the second device structure layer.

11. The semiconductor device of claim 10, wherein a distance between the second seal ring and the pattern structure is greater than or equal to 2 times a width of second pad.

12. The semiconductor device of claim 1, wherein the plurality of the first pads comprises at least one first electrically-connected pad and at least one first dummy pad, the plurality of the second pads comprises at least one second electrically-connected pad and at least one second dummy pad, each first electrically-connected pad is connected to a corresponding second electrically-connected pad of the at least one second electrically-connected pad, and each first dummy pad is connected to a corresponding second dummy pad of the at least one second dummy pad.

13. The semiconductor device of claim 12, wherein the first electrically-connected pad is electrically connected to the first device structure layer.

14. The semiconductor device of claim 12, wherein the second electrically-connected pad is electrically connected to the second device structure layer.

15. The semiconductor device of claim 1, wherein there is no first pad between the first seal ring and the pattern structure, and there is no second pad between the second seal ring and the pattern structure.

16. The semiconductor device of claim 1, wherein a width of the first seal ring is the same as a width of the second seal ring.

17. The semiconductor device of claim 1, wherein a width of the first seal ring is different from a width of the second seal ring.

18. The semiconductor device of claim 1, wherein there is a second interface between the first pad and the second pad.

19. The semiconductor device of claim 1, wherein the second device structure layer comprises a memory structure layer.

20. The semiconductor device of claim 19, wherein the memory structure layer comprises a three-dimensional (3D) flash memory structure.

* * * * *